(12) United States Patent
Grohoski et al.

(10) Patent No.: US 7,795,899 B1
(45) Date of Patent: Sep. 14, 2010

(54) ENABLING ON-CHIP FEATURES VIA EFUSES

(75) Inventors: Gregory F. Grohoski, Bee Cave, TX (US); Christopher H. Olson, Austin, TX (US); Thomas Alan Ziaja, Pflugerville, TX (US); Lawrence A. Spracklen, Boulder Creek, CA (US)

(73) Assignee: Oracle America, Inc., Redwood City, CA (US)

( * ) Notice: Subject to any disclaimer, the term of this patent is extended or adjusted under 35 U.S.C. 154(b) by 0 days.

(21) Appl. No.: 12/420,056

(22) Filed: Apr. 8, 2009

(51) Int. Cl.
  *H03K 19/00* (2006.01)
(52) U.S. Cl. .................... 326/8; 326/9; 326/38
(58) Field of Classification Search ............ None
  See application file for complete search history.

(56) References Cited

U.S. PATENT DOCUMENTS

2004/0129952 A1* 7/2004 Griesmer et al. .......... 257/202
2006/0195901 A1* 8/2006 Kelley et al. ............. 726/18

* cited by examiner

*Primary Examiner*—Anh Q Tran
(74) *Attorney, Agent, or Firm*—Rory D. Rankin; Meyertons, Hood, Kivlin, Kowert & Goetzel, P.C.

(57) ABSTRACT

Systems and methods for enabling on-chip features via efuses. A system comprises an electronic fuse (Efuse) array (EFA) coupled to each features capability register (FCR) within an instantiated computational block. The EFA comprises a plurality of rows wherein programming an row comprises blowing one or more Efuses of the row. A valid row comprises programmed Efuses corresponding to one or more on-chip enabled features. The EFA is further configured to prevent enabling of disabled on-chip features from occurring subsequent to a predetermined point in time, such as the time of shipping the chip to the field for use by end-users, by establishing a particular default state for electronic fuses and rendering unusable any unprogrammed entries of the EFA. In one embodiment, some features correspond to on-chip hardware cryptographic acceleration. By preventing the ability to re-enable these features after shipping, it is possible to send semiconductor chips to foreign countries with only predetermined features enabled and no threat of disabled features being later enabled.

20 Claims, 4 Drawing Sheets

ENABLING ON-CHIP FEATURES VIA EFUSES

BACKGROUND OF THE INVENTION

1. Field of the Invention

This invention relates to computing systems, and more particularly, to controlling access to on-chip features of a processing device.

2. Description of the Relevant Art

A country's bureau of industry and security, in one example, typically sets export regulations based on economic and national security reasons. These regulations may facilitate trade to predetermined reliable foreign customers, while denying access to sensitive technologies to other foreign customers acting contrary to a nation's security and foreign policy interests. One example of sensitive technology is cryptographic processes. Cryptographic processes are used to protect information being sent and code to be executed.

In cryptography, a cipher is a series of well-defined steps, or an algorithm, for performing encryption and decryption. In one embodiment, the encrypting procedure may be varied based on a key—for example, a 128 bit value used during both the encryption and decryption steps. A key may need to be selected before using a cipher to encrypt a message. Without knowledge of the key, it may be difficult, if not nearly impossible, to decrypt the resulting cipher into readable plain text. Block ciphers work on blocks of symbols or data usually of a fixed size, and stream ciphers work on a continuous stream of symbols or data. Some examples of ciphers include Advanced Encryption Standard (AES), Secure Hash Algorithm 1 (SHA1), Rivest, Shamir, and Adleman (RSA); Rivest Cipher 4 (RC4); Message Digest algorithm 5 (MD5); Elliptic Curve Cryptosystem (ECC) algorithm; Data Encryption Standard (DES), and Triple DES (3DES).

Software, or off-chip hardware cards, have been used to execute cipher operations. However, security came at a price as system performance was reduced. Later, on-chip hardware accelerators were utilized to execute cipher operations. Integrated cryptographic acceleration enables applications to run securely without the extra cost of a separate cryptographic processor. In one embodiment, each processor core, or core, of a microprocessor may include both a floating point unit and a cryptographic processing unit separate from an integer execution unit, wherein the cryptographic processing unit provides on-chip cryptographic acceleration. Such a unit may include a modular arithmetic unit (MAU) and a cipher/hash unit (CHU), which facilitates high-speed encryption and decryption by executing in parallel with other processor functions. These cryptographic functions are used in commercial and financial applications and if the cipher is broken, the outcome could be devastating. In addition, it may be desired to restrict the export of these on-chip features for a government's economic, security, or other reasons.

One mechanism for restricting the export of certain on-chip features is to place on-chip hardware acceleration under hypervisor control. The system may be set up to allow only the hypervisor to access to the hardware. In such a case, the hypervisor must export an application programmer's interface (API) that can be used by the operating system and/or user-level applications. For export compliance, a special version, or less feature-enabled version, of the hypervisor is utilized. However, a hypervisor can be hacked. Moreover, due to the overhead in accessing the cryptographic hardware via a hyperprivileged API, it has become desirable to enable direct user-level access of cryptographic acceleration. This can be accomplished by providing user-level instructions, which accelerate a particular cryptographic function.

Another mechanism for restricting access to certain on-chip features is to utilize a fuse array, or a fuse read-only memory (ROM). Laser fuses, electronic fuses (Efuses), and soft fuses are examples of fuse technology used for increasing yield by being programmed to enable a redundant chip block, such as a large static random-access memory (SRAM) in the manufacturing process, but a continued ability to program is not available in the field. For purposes of discussion, the "Efuse" may be used herein to refer to laser, electronic, soft, or other fuse technologies. Typically, a fuse is blown at manufacturing time, and its state generally can't be changed once blown. Fuses may be used to minimize schedule risk and maximize yield. Also, fuses may be used to encode manufacturing information, such as a chip serial number. In addition, fuses may be used to enable certain features, such as cryptographic processes.

However, the fuses may be subsequently bypassed in order to allow for changes to the manufacturing configuration during subsequent testing. The fuses can be bypassed by using the highly available joint test action group (JTAG) interface. Chip-specific JTAG commands can be issued which set bits in a fuse shadow register, which overrides the value of the fuse. Also, it is possible to re-program a fuse array by blowing additional bits in a row, or entry, already programmed. This ability is used during manufacturing to correct mistakes, which invalidates the row due to an incorrect row parity value. Such a row would be discarded by hardware when it reads the fuse array to determine chip configuration. Thus, if a fuse is required to be blown to disable cryptographic access, a fuse entry disabling a cryptographic function could be rendered invalid by programming additional bits in the row.

In addition, a fuse array may allow for multiple rows to be programmed for a same destination or function, with a latter row's values replacing a former row's values. This allows manufacturing to replace an incorrect row with a second correct row without a need to mark the first row as unusable. Such a mechanism allows a fuse to be programmed without regard to ordering the entries. However, an exposure to this mechanism is someone could simply program additional latter rows in order to replace the former rows, which disable a certain cryptographic functionality.

In view of the above, efficient methods and mechanisms for restriction of export controlled features are desired.

SUMMARY OF THE INVENTION

Systems and methods for efficient restriction of export-controlled features are contemplated. In one embodiment, a system is provided comprising an electronic fuse (Efuse) array (EFA) coupled to a features capability register (FCR) within each processor core of a microprocessor, or other instantiated computational block. The EFA comprises a plurality of rows, or entries, wherein programming an entry comprises blowing one or more Efuses of the entry. A valid entry comprises programmed Efuses corresponding to one or more on-chip features. Each FCR corresponds to one of the plurality of entries. Each FCR is configured to store at least an enable bit for each on-chip feature corresponding to the entry based upon one or more corresponding Efuse states. The EFA is further configured to prevent enabling of any disabled on-chip feature from occurring subsequent to a predetermined point in time. Such a predetermined point in time may be the time of shipping the chip to the field for use by end-users. In one embodiment, one or more features correspond to on-chip hardware cryptographic acceleration. By preventing the ability to re-enable these features after shipping, it is possible to send semiconductor chips to foreign countries with only predetermined features enabled and no threat of disabled features being later enabled.

These and other embodiments will become apparent upon reference to the following description and accompanying drawings.

Figure 1:
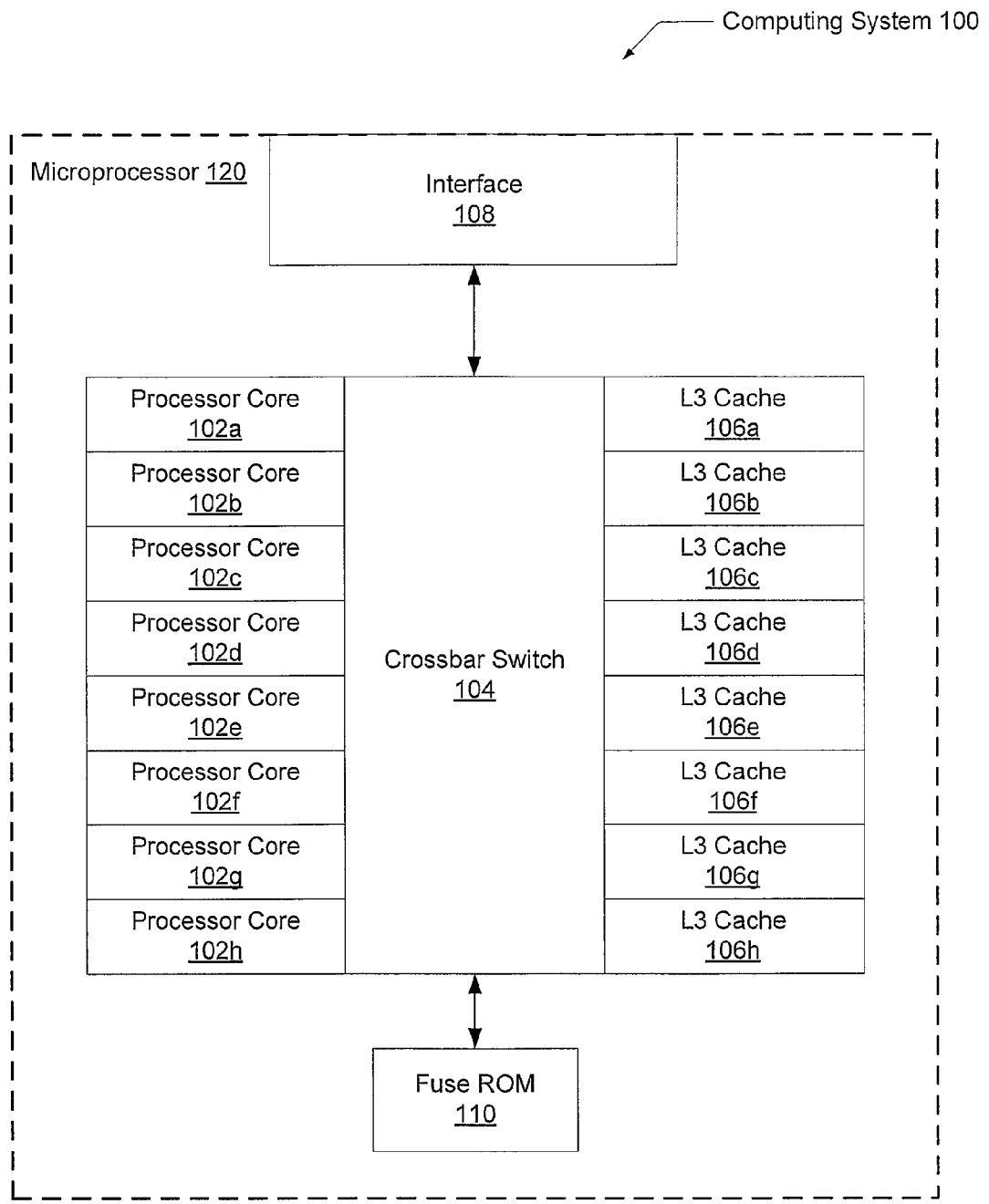
FIG. 1 is a generalized block diagram illustrating one embodiment of a computing system with a datacenter.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, signals, computer program instruction, and techniques have not been shown in detail to avoid obscuring the present invention.

Referring to FIG. 1, one embodiment of a computing system 100 with a microprocessor 120 comprising multiple instantiated cores 102a-102h is shown. In one embodiment, microprocessor 120 may be a standalone processor within a mobile laptop system, a desktop, an entry-level server system, a mid-range workstation, or other. For such an embodiment, microprocessor 120 may internally utilize a system bus controller for communication, which may be integrated in crossbar switch 104 or it may be a separate design. A system bus controller may couple microprocessor 120 to outside memory, input/output (I/O) devices such as computer peripherals, a graphics processing unit (GPU), or other. In such an embodiment, logic within such a system bus controller may replace or incorporate the functionality of a memory controller and interface logic 108.

In another embodiment, microprocessor 120 may be included in multiple processing nodes of a multi-socket system, wherein each node utilizes a packet-based link for internode communication. In addition to coupling processor cores 102a-102h to L3 caches 106a-106h, crossbar switch 104 may incorporate packet processing logic. Generally speaking, such logic may be configured to respond to control packets received on outside links to which microprocessor 120 may be coupled, to generate control packets in response to processor cores 102a-102h and/or cache memory subsystems, to generate probe commands and response packets in response to transactions selected by interface logic 108 for service, and to route packets for which microprocessor 120 may be included in a node that is an intermediate node to other nodes through interface logic 108. Interface logic 108 may include logic to receive packets and synchronize the packets to an internal clock used by packet processing logic.

As used herein, elements referred to by a reference numeral followed by a letter may be collectively referred to by the numeral alone. For example, processor cores 102a-102h may be collectively referred to as processor cores, or cores, 102. In one embodiment, microprocessor 120 has eight instantiations of a processor core 102. Each processor core 102 may utilize conventional processor design techniques such as complex branch prediction schemes, out-of-order execution, and register renaming techniques.

Each processor core 102 may support execution of multiple threads. Multiple instantiations of a same processor core 102 that is able to execute multiple threads may provide high throughput execution of server applications while maintaining power and area savings. Each core 102 may include circuitry for executing instructions according to a predefined instruction set. For example, the SPARC instruction set architecture (ISA) may be selected. Alternatively, the x86, Alpha, PowerPC, or any other instruction set architecture may be selected. Generally, processor core 102 may access a cache memory subsystem for data and instructions.

Each core 102 may contain its own level 1 (L1) and level 2 (L2) caches in order to reduce memory latency. These cache memories may be integrated within respective processor cores 102. Alternatively, these cache memories may be coupled to processor cores 102 in a backside cache configuration or an inline configuration, as desired. The L1 cache may be located nearer a processor core 102 both physically and within the cache memory hierarchy. Crossbar switch 104 may provide communication between the cores 102 and L3 caches 106. In addition, cores 102 may be coupled to double data rate dual in-line memory modules (DDR DIMM) that reside on a circuit board outside microprocessor 120. In one embodiment, DDR DIMM channel(s) may be on-chip in order to couple the cores 102 to the DDR DIMM off-chip. Each L3 cache 106 may be coupled to a memory controller or a dynamic random access memory (DRAM) channel for communication to DRAM that resides off-chip. Also, an interface to a system bus may be coupled to the each L3 cache 106.

Each core 102 may include one or more features capability registers (FCRs) for storing data used to enable or disable features and for storing supporting information for the respective enabled features. For example, FCRs may store encoded manufacturing information, such as a chip serial number; store information to identify and enable a redundant chip block, such as a large static random-access memory (SRAM), in order to increase yield; and store enable bits to enable one or more cryptographic processes. Other features are possible and contemplated.

The assignment of a FCR comprising one or more bits of storage to a particular feature may be predetermined in one embodiment. The assignment may be hardwired in hardware or set by basic input output software (BIOS) during boot-up of a system. Therefore, the assignments may be set only once, which may be done for security reasons, although, BIOS may be altered, or updated, at a later time.

The information to be stored in a FCR within each core 102 may have restrictions on both the source of the information and the window of time to update the FCR. For example, a fuse read-only memory (ROM) 110 may be utilized to convey information to the FCRs for storage. Each row, or entry, of the fuse ROM 110 may comprise a plurality of fields, such as an address or other identifier (ID) to identify an associated FCR within each core 102, row parity or other validating information, and the data to be stored in the FCR and later utilized by core 102.

Information to be utilized by each core 102 may be programmed into the fuse ROM during manufacture and testing of a semiconductor chip. For security reasons, the ability to program the fuse ROM 110 may be limited to prior to shipping microprocessor 120.

Figure 2:
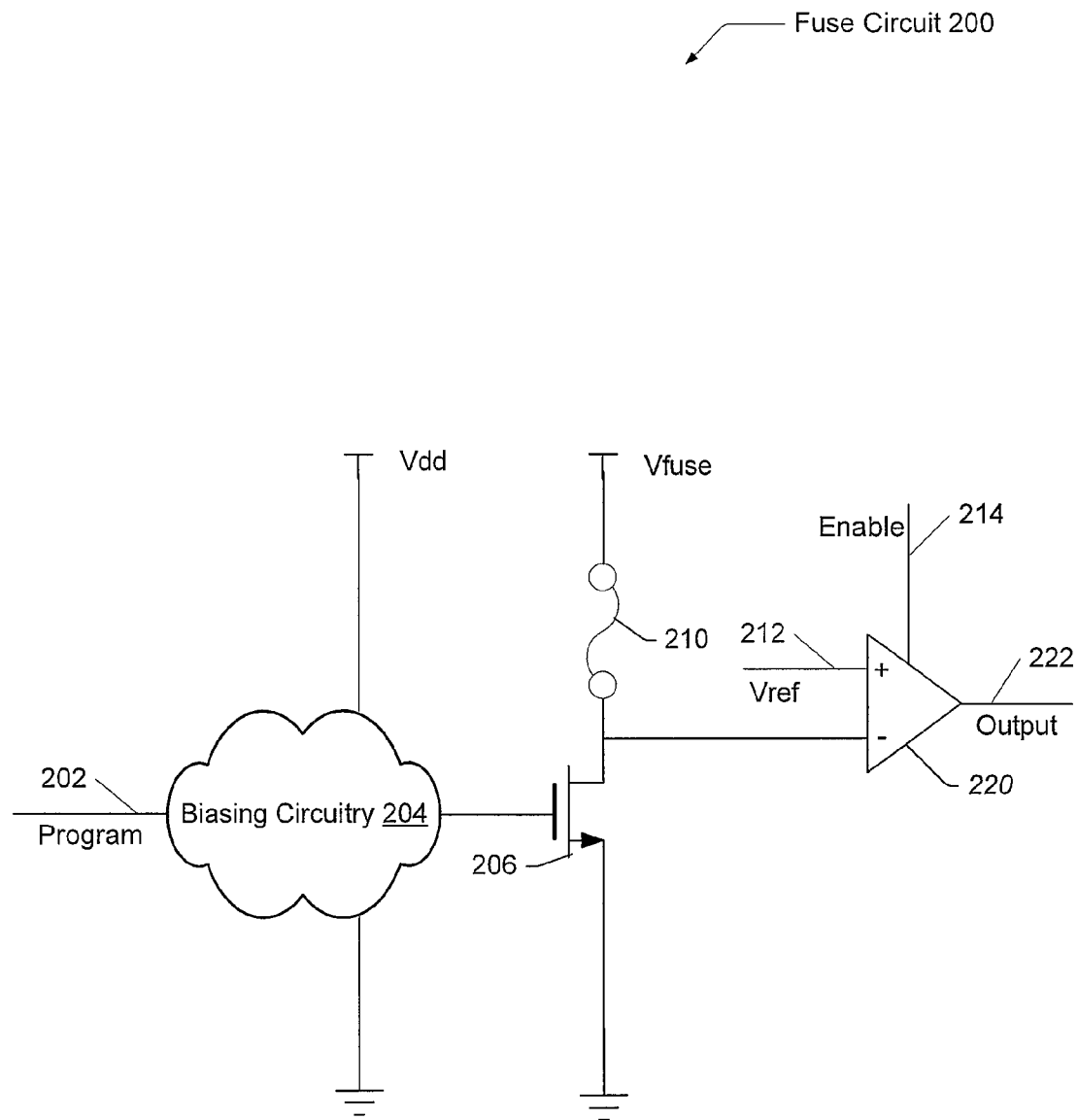
FIG. 2 is a generalized block diagram illustrating one embodiment of a fuse circuit.

Turning now to FIG. 2, one embodiment of a fuse circuit 200 is shown. Fuse circuit 200 may be any circuit capable of selectively blowing, programming, setting, or otherwise opening one or more fuses. A fuse is a resistor that has a particular resistance in an unblown state, such as 150 ohms, and another resistance in a blown state, such as 10 kilo-ohms. Any type of fuse may be used in fuse circuit 200. In one embodiment, fuse 210 in FIG. 2 is an electronic fuse (Efuse). An Efuse includes material that breaks down or is otherwise altered through the application of a voltage for a particular time period. In order to blow, or program, Efuse 210, circuit 200 may apply a relatively high voltage, Vfuse, across Efuse 210 for an appreciable time, such as 10 milliseconds, that causes a sustained high current to flow through both Efuse 210 and nmos transistor 206.

A program input line 202 is configured to receive a signal or pulse for programming, or setting, fuse 210. This signal may be supplied from an end-user via a chip input/output (I/O) pin or an output pin of a sequential element. In one embodiment, this signal is a logic high value, such as the supply voltage value Vdd, held for a predetermined sustained time. Biasing circuitry 204 relays a logic high value to nmos transistor 206 in a manner to assure a proper voltage level and timing required to selectively blow Efuse 210 upon the desired assertion of program input 202. Asserting the gate of nmos transistor 206 at a logic high value causes a current driven by Vfuse, which may be a same or greater value than Vdd, to traverse Efuse 210 and thereby blow Efuse 210. Alternatively, when the program input line 202 is asserted low, the gate of nmos transistor 206 is asserted at a logic low value, or a value near ground. Therefore, there is no path for current to traverse from Vfuse to ground, and Efuse 210 is not blown.

Biasing circuitry 204 may include transistors to assure a delay upon start-up that limits the possibility that Efuse 210 will be blown during boot-up when program input 202 may be unstable. When Efuse 210 is completely blown, a voltage near ground, or a logic low value, is asserted at the output of Efuse 210 and the input of sense amplifier 220. Sense amplifier 220 receives a reference voltage Vref 212 as an input in addition to an enable signal on enable signal line 214. The voltage value asserted on the line Vref 212 may be an output of a voltage divider using the supply voltage Vdd as in input.

In the case that Efuse 210 is blown, sense amplifier 220 senses a positive differential between its inputs as the fuse circuitry conveys a logic low value to the sense amplifier 220 and output 222 is asserted a logic high value. The signal on output 222 may be buffered before being routed to a sequential element. This output may be associated with a configuration bit. In contrast, when Efuse 210 is not blown, the output of Efuse 210 and the associated input of sense amplifier 220 is asserted at a voltage level near Vfuse, or a logic high value. Sense amplifier 220 senses a negative differential between its inputs and output 222 is asserted a logic low value. One of ordinary skill in the art will recognize a variety of circuit topologies that may be implemented and/or utilized in relation to one or more embodiments of the present invention.

Figure 3:
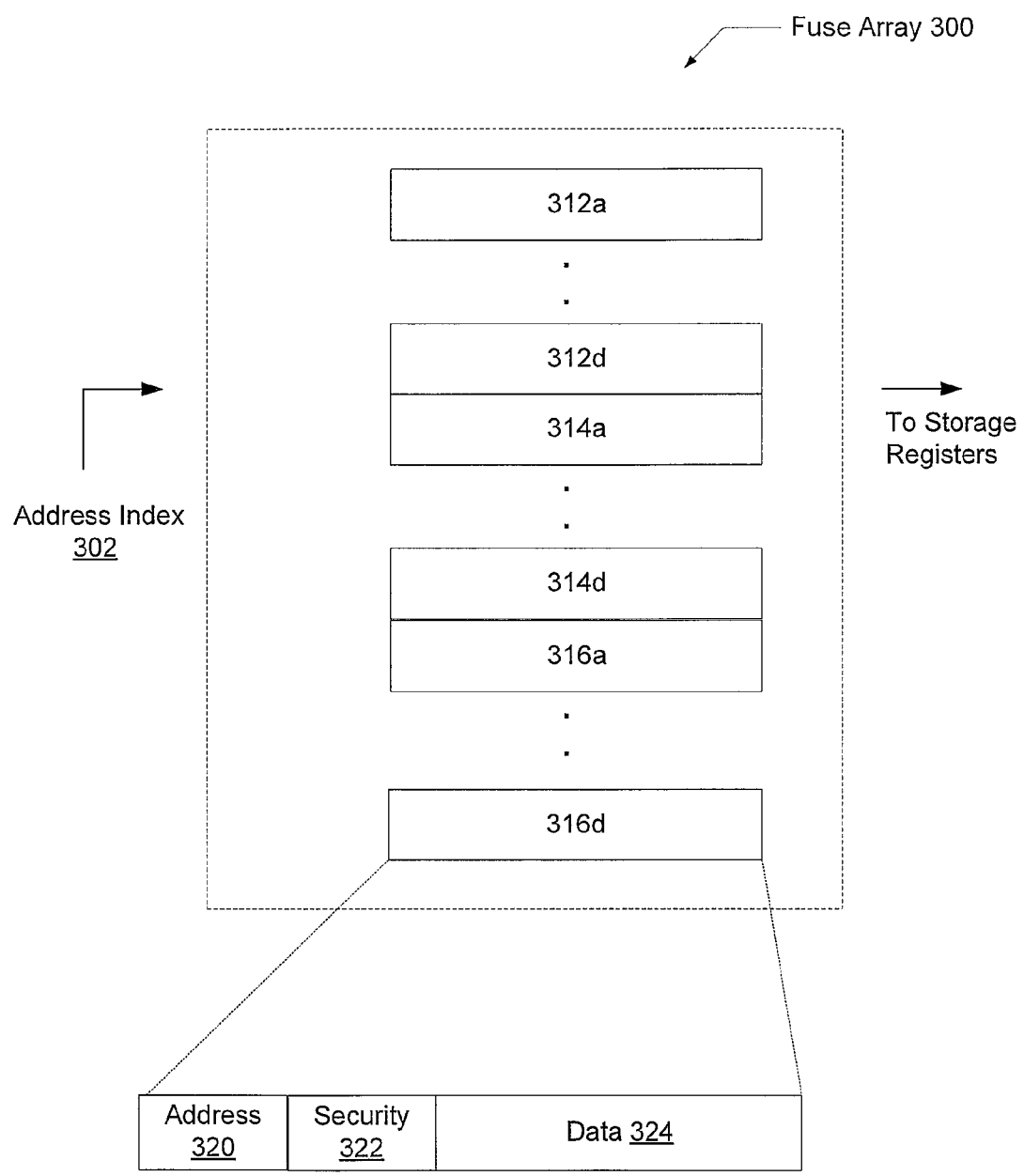
FIG. 3 is a generalized block diagram illustrating one embodiment of a fuse array.

Referring now to FIG. 3, one embodiment of a fuse array 300 is shown. Fuse array 300 comprises a plurality of entries 312, 314, and 316. More or less different types of entries may be utilized in other embodiments. The difference between the entries corresponds to the information stored therein. For example, entry 316 may have an address field 320, a security field 322, and a data field 324. Entries 312 and 314 may have similar fields of different widths, or have additional fields. For example, entries 314 may be used for repair of SRAMS, whereas entries 316 may be used for enabling on-chip cryptographic acceleration.

Array 300 may be incorporated in a fuse farm that includes a fuse controller coupled to fuse array 300. Such a fuse controller may include a JTAG interface for testing, a system interface for providing an end-user interface for programming fuse array 300, a power management interface, and so forth. Also, such a fuse controller may be coupled to registers for storing entry information read from fuse array 300. These stored values may be subsequently relayed to cores 102 of FIG. 1 during a boot-up process.

Access logic for reading and writing entries 312, 314, and 316 may include an address index 302 that indexes fuse array 300. During a write operation, in one embodiment, the next available empty row, or empty entry, may be indexed for programming the corresponding Efuses 210 within the row. An empty row may be referred to as a non-programmed row, or a non-programmed entry. Data derived during a manufacturing and testing stage may be read from registers and conveyed to fuse array 300 by a fuse controller. This data may be applied to the program signal lines 202 of fuse circuits 200 within a corresponding entry of fuse array 300. In one embodiment, the address field 320 may be written with an identifier that identifies a configuration register corresponding to a redundant SRAM within a core 102 that needs to be enabled to repair another failing SRAM. In another embodiment, the address field 320 may be written with an identifier that identifies a configuration register corresponding to one or more cryptographic processes to be enabled for hardware acceleration within cores 102. A security field 322 may be written with a row parity value in order to later invalidate the row if it is subsequently overwritten. Data field 324 may be written with supporting information such as a key value for a cipher algorithm or an address range for SRAM repair.

For a read operation, address index 302 may be used by access logic to index a particular entry, or row, within fuse array 300. The corresponding data may be conveyed to storage registers coupled to a fuse controller. In one embodiment, during a boot-up process of microprocessor 110, the fields 320-324 may be read out serially by a linear shift register and later conveyed to corresponding configuration registers within each core 102. These configuration data may only need to be read during a boot-up process and the time requirement to convey this information to each core 102 may be relaxed. Also, by serially shifting out the information from fuse array 300, no parallel buses are utilized, which reduces on-chip real estate and potential noise on signal lines. It is noted that for a given valid programmed entry within fuse array 300 corresponding to a particular set of one or more features, a subsequent valid programmed entry corresponding to the particular set of one or more features, such as particular cipher algorithms, overrides the given valid programmed entry. For example, the contents of the subsequent valid programmed entry may overwrite the contents of the given valid programmed entry stored in a corresponding configuration register within each core 102 when a serial linear shifting process has completed during a boot-up process.

Figure 4:
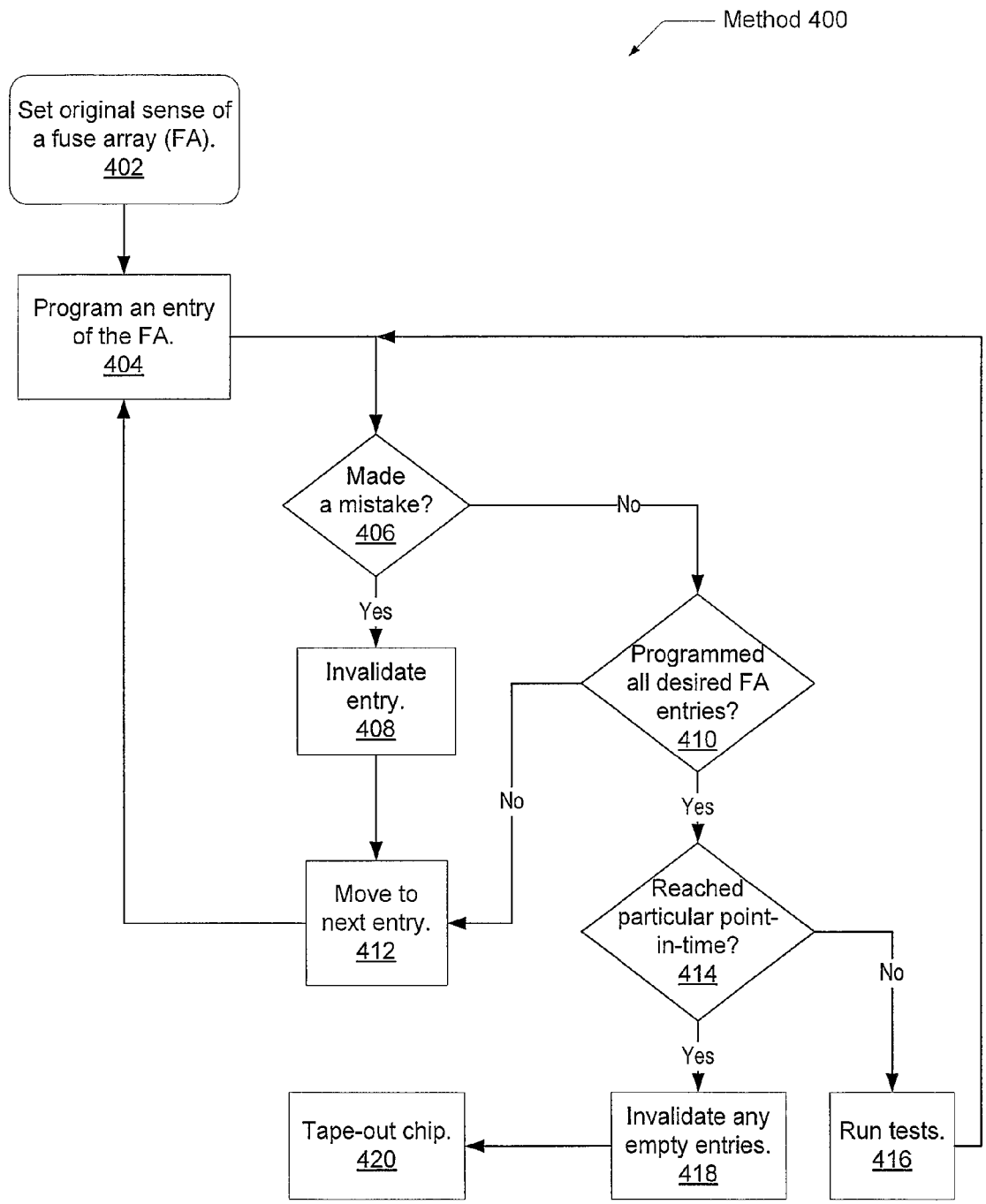
FIG. 4 is a generalized flow diagram illustrating one embodiment of a method for efficient restriction of export controlled features.

Turning now to FIG. 4, one embodiment of a method 400 for efficient restriction of export controlled features is illustrated. The components embodied in the computer system described above may generally operate in accordance with method 400. For purposes of discussion, the steps in this embodiment are shown in sequential order. However, some steps may occur in a different order than shown, some steps may be performed concurrently, some steps may be combined with other steps, and some steps may be absent in another embodiment.

In block 402, during a manufacturing and testing stage prior to shipping microprocessor 110, an original sense, or initial state, of each Efuse 210 in fuse array 300 is chosen. For example, typically the original sense of a corresponding Efuse 210 is it enables a feature, such as on-chip hardware support of a cryptographic process. However, in this invention, the original sense of a corresponding Efuse 210 is it disables a feature. Therefore, this corresponding Efuse 210 is programmed to enable cryptographic functionality rather than disable it.

An original sense as above prevents an end-user in the field from programming additional bits in an Efuse row 316, which invalidates the row, or renders the row unusable, due to a mismatching row parity value stored in security field 322, and, thus, re-enabling cryptographic functionality that had been disabled during manufacturing. Combinatorial logic within each core 102 that receives the stored content from corresponding configuration registers coupled to the fuse array 300 may interpret features without a valid programmed entry in the fuse array 300 as being disabled. In addition, combinatorial logic may interpret features with a valid programmed entry in the fuse array 300 and an unblown corresponding fuse as being disabled.

It is also possible to re-program an Efuse array by blowing additional bits in rows already programmed. This ability is used during manufacturing to correct mistakes or to invalidate rows, or render rows to be unusable. For example, some Efuses allow for rows to be marked as, or rendered, unusable by blowing additional bits to make the row parity incorrect. Such a row would be discarded by hardware in cores 102 when the cores 102 read the Efuse array to determine chip configuration. Thus, if an Efuse 210 is required to be blown in order to disable cryptographic access, then an Efuse entry disabling a cryptographic function could be rendered invalid by programming additional bits in the row. Now the corresponding cryptographic function is re-enabled in the field, which is undesirable. Therefore, it is desired to choose an original sense wherein an unblown corresponding Efuse 210 disables a cryptographic function, process, or feature.

An entry in fuse array 300 is programmed in block 404 during a manufacturing and testing stage as described earlier. If a mistake is made or a different configuration later needs to be inspected or tested (conditional block 406), then the corresponding entry needs to be invalidated in block 408. In one embodiment, additional bits of the entry are blown in order to make the corresponding row parity value incorrect and the entry is invalidated. Alternatively, an entry may be invalidated by programming an invalid ID into the entry. A number of such techniques are possible and are contemplated, and those skilled in the art will appreciate there are many ways a given entry may be invalidated or otherwise indicated to be invalid. A next available entry is next indexed in block 412. This next available entry may be a next immediate subsequent entry, or it may be an entry located farther away, but it is the next available empty row of fuse array 300.

If a mistake is not made (conditional block 406) and all of the desired fuse array 300 entries are programmed (conditional block 410), but a particular predetermined point-in-time is not reached (conditional block 414), then more tests may be run on microprocessor 110 in block 416. One example of a predetermined point-in-time is the preparation of the shipping of microprocessor 110 into the field to customers. Also, a predetermined point-in-time may be subsequent to completing a desired programming of the fuse array 300, wherein the desired programming is a programming of the fuse array 300 configured to, at a time of shipping the fuse array 300 to a customer, restrict the customer from utilizing at least one predetermined feature of the available on-chip features. Control flow of method 400 then returns to conditional block 416.

If a particular predetermined point-in-time is reached (conditional block 414), such as testing of microprocessor 110 is complete and preparation begins for the shipping of microprocessor 110 into the field, then any unused, or non-programmed, entries in fuse array 300 are invalidated in block 418.

In one embodiment, a fuse array 300 may allow for multiple rows to be programmed for the same destination or function, as denoted by a same address field 320, with the latter row replacing the former row. For example, a linear shift register simply replaces the contents of the former row with the contents of a second row at a later time during a boot-up process. This allows replacement of an incorrect row with a second correct row during manufacturing or testing without having to mark the first row as invalid. This allows an entry in fuse array 300 to be programmed without regard to the ordering of the entries.

However, without invalidating empty rows in block 418 of method 400, the above capability also allows an end-user in the field to program additional empty rows in fuse array 300 in order to replace previous rows that disable certain cryptographic functionality. This issue can be resolved by invalidating all unused rows in the fuse array 300 in block 418 before shipping. In addition, in previous designs, the fuse array 300 may be subsequently bypassed in order to allow for changes to the manufacturing configuration during subsequent testing. The fuses can be bypassed by using the joint test action group (JTAG) interface. Chip-specific JTAG commands can be issued which set bits in a fuse shadow register, which overrides the value of the fuse. It may be a simple matter to disable this capability for certain or all Efuses 210, by deleting the hardware to override these Efuses 210 and their corresponding configuration values.

Choosing an original sense for an Efuse 210 to disable a particular cryptographic function and invalidating empty rows in fuse array 300 allows microprocessor 110 to be exported with reliable restriction of cryptographic or other features. Then microprocessor 110 may be taped out and shipped in block 420.

In the field, after shipment of microprocessor 110, during program execution, hardware within each core 102 may utilize the value of an on-chip FCR, which may be renamed to a Cryptographic Capability Register (CCR) for cryptographic functions. For example, a given Efuse 210 in fuse array 300 may enable access to a particular cipher (e.g., AES) or a set of related ciphers (SHA-1, SHA-256). The value of this particular Efuse 210 may be read serially during boot-up as described earlier. The collective set of Efuse values that control cipher access can be grouped into the CCR. By default, cryptographic access is disabled.

The values stored in the CCR within core 102 may restrict hypervisor-level, operating system-level, and user-level access to the underlying on-chip hardware acceleration capability provided by a modular arithmetic unit (MAU), a cipher/hash unit (CHU), or other for cryptographic functions. For example, if the hardware accelerator circuitry is accessed by means of a control word queue (CWQ), a blown Efuse bit value stored in the CCR may enable access to all ciphers. The hardware simply considers the value of the CCR bit when it decodes instructions that attempt to access the CWQ registers. If the fuse bit is blown, the access is enabled. If the fuse bit is not blown, the access results in an exception.

Similarly, if the cryptographic acceleration is accessed by user-level instructions, such as by an instruction to perform an AES encryption, a fuse bit stored in the CCR may be associated with each such instruction or set of instructions. Combinatorial logic within core 102 may utilize the stored value in the CCR when decoding the instruction. If the corresponding fuse bit was blown, hardware successfully decodes the instruction and performs the related operation (e.g., encrypting an AES block). Otherwise, hardware decodes the instruction as illegal, and generates an exception, such as an illegal opcode trap.

It is noted that the above-described embodiments may comprise software. In such an embodiment, the program instructions that implement the methods and/or mechanisms may be conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
an electronic fuse (Efuse) array (EFA) that includes a plurality of programmable entries, wherein for a given valid programmed entry corresponding to a particular set of one or more features, a subsequent valid programmed entry corresponding to the particular set of one or more features overrides the given valid programmed entry;
circuitry configured to interpret features of the one or more features without a valid programmed entry in the EFA as being disabled; and
wherein the EFA includes one or more entries with desired programming, and one or more entries following said entries with the desired programming are rendered unusable.

2. The system as recited in claim 1, wherein an unblown Efuse of a programmed entry indicates a feature which corresponds to the unblown Efuse is disabled.

3. The system as recited in claim 2, wherein both the given valid programmed entry and the subsequent valid programmed entry comprise a same identifier (ID), the ID serving to identify the particular set of one or more features.

4. The system as recited in claim 3, wherein each programmed entry of the EFA comprises one or more Efuses, wherein a blown Efuse indicates a corresponding feature is enabled, and wherein an unblown fuse indicates a corresponding feature is disabled.

5. The system as recited in claim 4, wherein said system is configured to convey information from the EFA such that it may not be altered or bypassed via an alternate interface.

6. The system as recited in claim 1, wherein an unusable entry of the EFA comprises at least one of the following: (i) an invalid identification (ID) value programmed into an ID field of the unusable entry; and (ii) an incorrect parity value programmed in a parity field of the unusable entry.

7. The system as recited in claim 4, wherein said one or more features include at least one of the following: hardware acceleration of a particular cryptographic cipher operation, a user-level instruction configured to accelerate a particular cipher function, a manufacturing serial number, and repair information of a non-chip static random access memory (SRAM).

8. The system as recited in claim 4, further comprising circuitry configured to generate an exception responsive to execution of an instruction attempting to utilize a feature which said EFA indicates is disabled.

9. A method for securing programming of a device, the method comprising:
programming one or more entries of an electronic fuse (Efuse) array (EFA) that includes a plurality of programmable entries, wherein for a given valid programmed entry corresponding to a particular set of one or more features, a subsequent valid programmed entry corresponding to the particular set of one or more features overrides the given valid programmed entry;
interpreting features of the one or more features without a valid programmed entry in the EFA as being disabled; and
rendering unusable one or more non-programmed entries of the programmable entries, subsequent to completing a desired programming of the EFA.

10. The method as recited in claim 9, wherein an unblown Efuse of a programmed entry indicates a feature which corresponds to the unblown Efuse is disabled.

11. The method as recited in claim 10, wherein both the given valid programmed entry and the subsequent valid programmed entry comprise a same identifier (ID), the ID serving to identify the particular set of one or more features.

12. The method as recited in claim 11, wherein each programmed entry of the EFA comprises one or more Efuses, wherein a blown Efuse indicates a corresponding feature is enabled, and wherein an unblown fuse indicates a corresponding feature is disabled.

13. The method as recited in claim 12, wherein said system is configured to convey information from the EFA such that it may not be altered or bypassed via an alternate interface.

14. The method as recited in claim 9, wherein an unusable entry of the EFA comprises at least one of the following: (i) an invalid identification (ID) value programmed into an ID field of the unusable entry; and (ii) an incorrect parity value programmed in a parity field of the unusable entry.

15. The method as recited in claim 12, wherein said one or more features include at least one of the following: hardware acceleration of a particular cryptographic cipher operation, a user-level instruction configured to accelerate a particular cipher function, a manufacturing serial number, and repair information of a non-chip static random access memory (SRAM).

16. The method as recited in claim 12 further comprising generating an exception responsive to execution of an instruction attempting to utilize a feature which said EFA indicates is disabled.

17. A computer readable storage medium storing program instructions operable for securing programming of a device, wherein the program instructions are executable to:
program one or more entries of an electronic fuse (Efuse) array (EFA) that includes a plurality of programmable entries, wherein for a given valid programmed entry corresponding to a particular set of one or more features, a subsequent valid programmed entry corresponding to the particular set of one or more features overrides the given valid programmed entry;

interpret features of the one or more features without a valid programmed entry in the EFA as being disabled; and render unusable any non-programmed entries of the programmable entries, subsequent to completing a desired programming of the EFA.

18. The storage medium as recited in claim 17, wherein an unblown Efuse of a programmed entry indicates a feature which corresponds to the unblown Efuse is disabled.

19. The storage medium as recited in claim 18, wherein both the given valid programmed entry and the subsequent valid programmed entry comprise a same identifier (ID), the ID serving to identify the particular set of one or more features.

20. The storage medium as recited in claim 19, wherein each programmed entry of the EFA comprises one or more Efuses, wherein a blown Efuse indicates a corresponding feature is enabled, and wherein an unblown fuse indicates a corresponding feature is disabled.

* * * * *